United States Patent [19]

Mantone et al.

[11] Patent Number: 5,551,144
[45] Date of Patent: Sep. 3, 1996

[54] METHOD OF MAKING INSULATED SUPERCONDUCTING MAGNET COIL

[75] Inventors: Deborah R. Mantone, Effingham; Barbara L. Myers, Florence, both of S.C.

[73] Assignee: General Electric Company, Milwaukee, Wis.

[21] Appl. No.: 366,186

[22] Filed: Dec. 29, 1994

[51] Int. Cl.$^6$ ............................................. H01L 39/24
[52] U.S. Cl. .......................... 29/599; 310/194; 310/214; 505/430; 505/433
[58] Field of Search .................... 29/599, 605; 310/194, 310/214; 505/430, 433, 434

[56] References Cited

U.S. PATENT DOCUMENTS

| | | | |
|---|---|---|---|
| H383 | 12/1987 | Skoritka | 29/599 |
| 3,549,926 | 12/1970 | Pentland . | |
| 3,868,766 | 3/1975 | Gramlich et al. | 29/605 X |
| 4,377,905 | 3/1983 | Agatsuma et al. | 29/599 |
| 5,084,955 | 2/1992 | Yamasaki et al. | 29/599 |
| 5,293,524 | 3/1994 | Mookerjee et al. | 29/599 X |

FOREIGN PATENT DOCUMENTS

| | | | |
|---|---|---|---|
| 56-150811 | 11/1981 | Japan | 29/599 |
| 58-147019 | 9/1983 | Japan | 29/605 |
| 59-222904 | 12/1984 | Japan | 29/599 |

OTHER PUBLICATIONS

IEEE Transactions on Magnetics, vol. MAG 15–No. 1 Jan. 1979, pp. 106–107.

*Primary Examiner*—Carl J. Arbes
*Attorney, Agent, or Firm*—Irving M. Freedman; John H. Pilarski

[57] ABSTRACT

A method of forming a crepe paper insulated superconducting magnet coil with fifty percent overlap crepe paper wrapping with the paper wound superconductor subsequently wound into a coil on a coil form pocket using the crepe paper wrap as an insulating and friction reducing component.

10 Claims, 1 Drawing Sheet

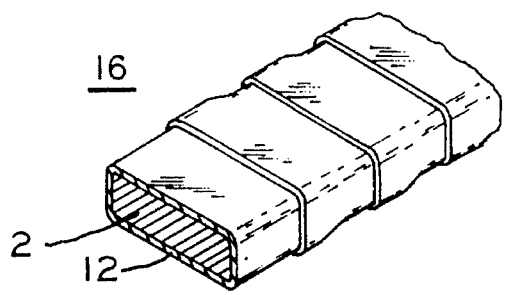
FIG_1
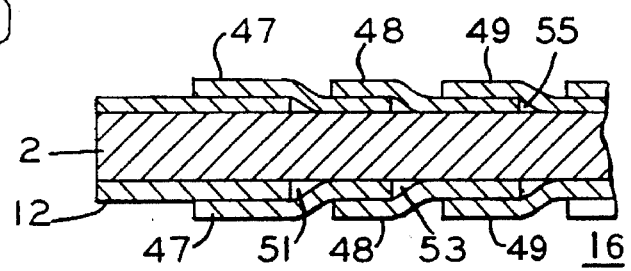
FIG_2
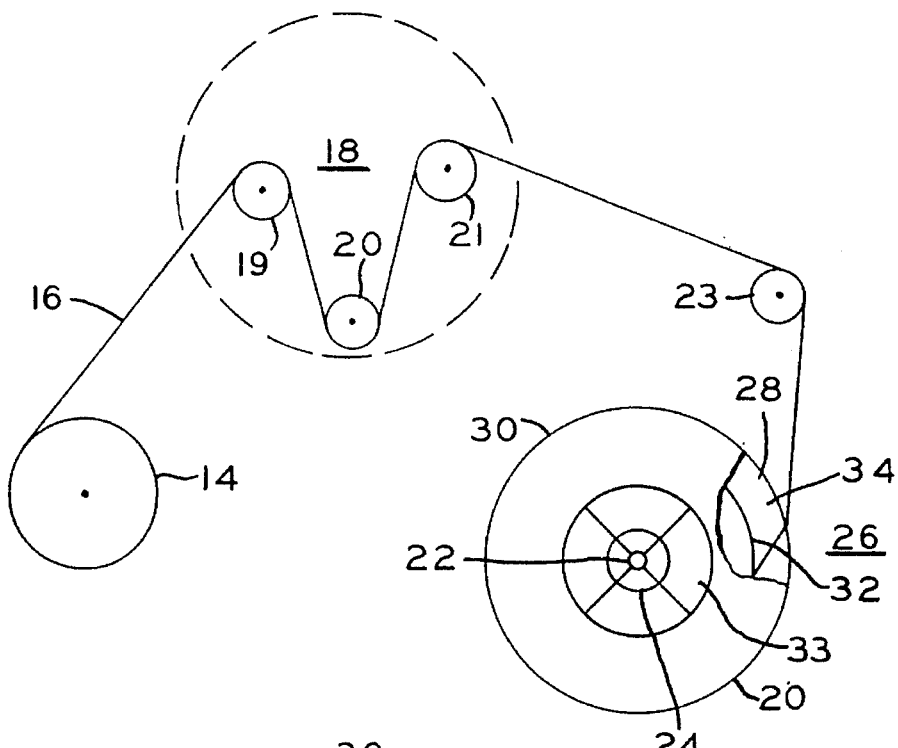
FIG_3
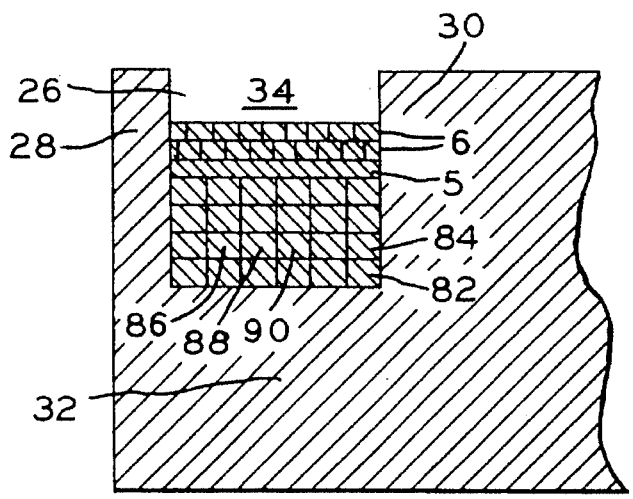
FIG_4

METHOD OF MAKING INSULATED SUPERCONDUCTING MAGNET COIL

BACKGROUND OF INVENTION

This invention relates to a method and apparatus for manufacturing superconducting magnet coils for use in magnetic resonance imaging (herein after called "MRI"), and more particularly, to an insulated superconductor for use in superconducting magnet coils.

As is well known, a magnet can be made superconducting by placing superconducting magnet coils in an extremely cold environment, such as by enclosing it in a cryostat, or pressure vessel, containing liquid helium or other cryogen. The extreme cold reduces the resistance in the magnet coils to negligible levels, such that when a power source is initially connected to the coil (for a period, for example, of 10 minutes) to introduce a current flow through the coils, the current will continue to flow through the coils due to the negligible resistance, even after power is removed, thereby maintaining a magnetic field. Superconducting magnets find wide application, for example, in the field of medical magnetic resonance imaging.

The superconducting magnetic field is generated by current flow through superconducting magnet coils, typically having a diameter on the order of 45 to 75 inches and including six or more main magnet coils, each having as many as 1500 turns. The many turns and layers of turns must be insulated from each other and the insulation integrity must be maintained during superconducting operation, including the ramping up of the coils to the operating current, and the possible sudden quenching, or discontinuance, of superconducting operation. Any shorting of magnet coil turns can produce heat which can lead to very serious inadvertent quenching of magnet operation which leads to sudden escape of helium and the need to replenish the liquid helium and again ramp the MRI magnet up to operating current entailing significant equipment down time and expense. Such shorting could also damage the superconducting wire, rendering the magnet inoperable. Because of the extremely high current levels involved in the high strength magnetic fields, the superconducting magnet coils must undergo extreme and difficult operating environment and forces, including significant thermal, magnetic, electrical and mechanical forces generated during such operations. As a result, the cost of producing superconducting magnet coils and magnets is relatively high, frequently costing into the hundreds of thousands of dollars for a single MRI magnet assembly. The use of "barber pole" spaced windings with insulating separators of materials such as Nomex between coil layers adds significantly to the material and labor required to fabricate superconducting magnet coils. In addition, problems in winding magnet coils due to friction between pockets in the coil support, or cartridge and the insulated superconductor can result in defects and failures in operation.

As a result, it is extremely important that superconducting magnet coils be capable of reliable operation without failures, and yet must be manufactured as inexpensively as possible in order to reduce the high cost of MRI3 s, to make such equipment more universally available.

OBJECTS AND SUMMARY OF INVENTION

It is an object of the present invention to provide superconducting coils exhibiting the ability to withstand the thermal, magnetic, electrical and mechanical stresses posed during operation, including quenching and ramping up of the magnets to operating current.

It is another object of the present invention to facilitate the winding of superconducting magnet coils into a coil support pocket without additional friction-reducing components and without damaging the resultant insulation between coil turns and layers.

It is yet another object of the present invention to provide and improve superconducting magnet coils with adequate and improved insulation while minimizing magnet cost.

In accordance with one form of the invention, a superconducting magnet coil for use in magnetic resonance imaging is formed by wrapping a superconductor with overlapping layers of crepe paper insulation and winding the insulated superconductor onto a coil support structure to form a superconducting coil. The crepe paper is approximately 0.003 inches thick and 7/16 to ½ inches wide with overlap control to provide approximately a fifty percent overlap of each winding of insulation over the previous winding and an insulation thickness of approximately 0.006 inches. The tension on the crepe paper wrapped superconducting wire during coil winding is controlled to approximately 3,900–4,200 pounds per square inch. An electrical insulation barrier of ¼ inch thick glass paper is wrapped around the coil. A retaining band of aluminum wire may be secured around the outer periphery of the coil.

BRIEF DESCRIPTION OF INVENTION

FIG. 1 is a transverse cross-sectional view showing details of the insulation on the superconducting wire in accordance with the present invention.

FIG. 2 is an axial cross section of the insulation on the superconducting wire.

FIG. 3 is a side view, partially in sections, showing the present invention.

FIG. 4 shows in cross-section details of a portion of the winding of a coil wound in accordance with the present invention.

Referring FIG. 1, crepe paper 12 is wrapped around superconductor 2. Crepe paper 12 is 0.003" thick and ½" to 7/16" wide. It is made by Dennison Manufacturing Company, Framingham, Mass. and is sold as their Densiflex 22 HCC crepe paper. Crepe paper 12 is wrapped around the superconductor using wrapping machine 14 of Virginia Insulated Products, Saltville, VA.

As best shown in FIG. 2, crepe paper 12 is wrapped around superconductor 2 in a overlapping fashion to provide approximately a fifty percent overlap such that, for example, turn 48 overlaps fifty percent of turn 47 and 49 in turn overlaps fifty percent of turn 48. Turns 47 and 49 would be substantially side by side if turn 48 were not interposed, providing compressible air pockets such as 51, 53 and 55 which in turn provide resiliency and flexibility to crepe paper wrapped superconductor 16.

Referring next to FIG. 3, crepe paper wrapped superconductor 16 is fed from supply spool 14 around an idler pulley system 18 including pulleys 19, 20 and 21 and past pulley 22, to coil pocket 26 of coil support member or cartridge 20, which is fiberglass-reinforced plastic having an outer diameter in the range of 45 to 75 inches. A coil region or pocket 26 is formed between adjacent walls of coil support member 20 about the circumferential region formed by core 32. The internal diameter of this structure forms a central open patient imaging bore 33.

As is well known in the MRI magnet art, superconducting coil 34 is formed of a plurality of turns and layers of superconductor 16 windings as shown in FIG. 4, and is described below. Coil support member 20 is driven by variable speed drive motor 24 mounted on shaft 22 which ratably supports the coil support member. Superconducting coils fabricated in accordance with the present invention are wound directly into coil pocket 26 without the necessity of friction-reducing components added to coil pocket walls 28, 30 and 32 or between adjacent coil layers, even though insulation wrapped superconductor 16, consisting of adjacent and overlapping turns of crepe paper, contacts and walls 28, 30 and 32 of coil support member 20 and adjacent coil turns and layers during the winding operation.

By way of summary, and with reference to FIG. 1 and FIG. 2, crepe paper 12 is wrapped around superconductor 2 with forty-five to fifty-five percent overlap. With reference to FIGS. 3 and 4, crepe paper insulated superconductor 16 is wound into a coil support pocket 26. Tension is controlled on insulated superconductor 16 by idler pully system 18 to the range of approximately 3900–4200 pounds per square inch to provide a uniform coil build which has additional flexibility for slight movement during winding and ramping. The wound superconducting coil is then wound with eletrically insulating ¼" thick glass paper 5 to provide an electrically insulated barrier and then wrapped with aluminum restraining wire band 6. The crepe paper 12 winding provides low friction resiliency during winding and subsequent operation of superconducting coil 34, and provides significant cost savings over prior art layered superconducting coils.

FIG. 4 shows details of a portion in cross-section of superconducting coil 34 in coil pocket 26 of coil support member 20. Coil 34 includes a plurality of layers such as 82 and 84 of insulated side by side superconductor 16. Turns such as 86, 88 and 90 make the coil layer. Layer 84 is wound directly over layer 82 upon completion of layer 82, it being noted that there is no additional insulation needed between the layers since the turns of crepe paper 12 around superconductor 2 overlap completely forming a double thickness of insulation having low friction resiliency useful in the winding of adjacent turns of the coil such as 86, 88 and 90 and in the superconducting operation of coil 34. Also, there is no need for any additional friction reducing members either in coil support member 20 or between coil turns such as 86, 88 and 90. The coil layers are then wound with glass paper layer 5 and aluminum wire band 6.

While the present invention has been described with respect to certain preferred embodiments thereof, it is to be understood that numerous variations in the details of construction, the arrangement and combination of parts, and the type of materials used may be made without departing from the spirit and scope of the invention.

What we claim is:

1. A method forming a superconducting magnet coil for use in magnetic resonance imaging comprising the steps of:

wrapping a superconductor with overlapping layers of crepe paper insulation;

winding the insulated superconductor into layers on a coil support structure to form a wound multilayer superconducting coil;

wherein said overlapping is controlled to provide approximately fifty percent overlap of the previous wrap to provide substantially double thickness flexible wrapping of said superconductor;

wherein said coil support structure includes a coil pocket formed between adjacent walls of said coil support using the crepe paper insulation as a friction reducing component;

securing a wire band around said superconducting coil after the application of an electrical insulating barrier;

wherein said electrical insulating barrier is wound With glass paper approximately ¼ inch thick; and said wire band is wound with aluminum.

2. The method of forming the superconducting magnet coil of claim 1 including the additional step of controlling the tension on said crepe paper wrapped wire to the range of 3900 to 4200 pounds per square inch during coil winding.

3. The method of forming the superconducting magnet coil of claim 2 wherein said wrapping of said crepe paper is controlled to provide spaces between adjacent layers of said crepe paper and said superconductor.

4. The method of forming the superconducting magnet coil of claim 3 wherein the tension on said crepe paper wrapped wire is controlled during said winding to utilize the low friction resiliency in the crepe paper insulation during said winding of said multilayer superconducting coil.

5. The method of forming the superconducting magnet coil of claim 4 wherein said tension is controlled to the range of approximately 3900 to 4200 pounds per square inch.

6. The method of forming a superconducting magnet coil of claim 5 including the additional steps of wrapping the wound multilayers with an insulated band.

7. A method of forming a superconducting magnet coil for use in magnetic resonance imaging comprising the steps of:

wrapping a superconductor with overlapping layers of crepe paper insulation;

winding the insulated superconductor into layers on a coil support structure to form a would multilayer superconducting coil;

wherein said overlapping is controlled to provide approximately fifty prevent overlap of the previous wrap to provide substantially double thickness flexible wrapping of said superconductor; and controlling the tension on said crepe paper wrapped during coil winding to provide spaces between adjacent layers of said crepe paper and said superconductor;

wherein said coil support structure includes a coil pocket formed between adjacent walls of said coil support using the low friction resiliency of said crepe paper insulation as a friction reducing component.

8. The method of forming the superconducting magnet coil of claim 7 wherein said tension is controlled to the range of approximately 3900 to 4200 pounds per square inch.

9. The method of forming a superconducting magnet coil of claim 8 including the additional step of wrapping the wound multilayers with an insulated band.

10. The method of forming the superconducting magnet coil of claim 8 wherein said paper is crepe paper approximately 0.003 inches thick and in the range approximately 7/16 to ½ inches wide and said overlap is controlled to provide an insulation wrap of approximately 0.006 inches.

* * * * *